(12) United States Patent
Komatsu

(10) Patent No.: US 7,015,588 B2
(45) Date of Patent: Mar. 21, 2006

(54) SEMICONDUCTOR DEVICE

(75) Inventor: Shigeyuki Komatsu, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 39 days.

(21) Appl. No.: 10/701,641

(22) Filed: Nov. 6, 2003

(65) Prior Publication Data
US 2004/0089912 A1 May 13, 2004

(30) Foreign Application Priority Data
Nov. 11, 2002 (JP) .......................... P2002-326482

(51) Int. Cl.
*H01L 23/48* (2006.01)
(52) U.S. Cl. ...................... 257/780; 257/781; 257/782; 257/784; 257/754
(58) Field of Classification Search ........ 257/754–756, 257/780–782, 784, 786
See application file for complete search history.

(56) References Cited

U.S. PATENT DOCUMENTS

| 5,751,065 A | * | 5/1998 | Chittipeddi et al. | 257/758 |
| 6,066,877 A | * | 5/2000 | Williams et al. | 257/341 |
| 6,133,054 A | * | 10/2000 | Henson | 438/17 |
| 6,229,221 B1 | * | 5/2001 | Kloen et al. | 257/784 |
| 6,329,259 B1 | * | 12/2001 | Johansson | 438/315 |

FOREIGN PATENT DOCUMENTS

| JP | 2-97053 A | 4/1990 |
| JP | 2001-284537 A | 10/2001 |

OTHER PUBLICATIONS

Silicon Processing for the VLSI Era, Stanley Wolf et al., vol. 1, p. 175.*

* cited by examiner

*Primary Examiner*—Jasmine Clark
(74) *Attorney, Agent, or Firm*—McDermott Will & Emery LLP

(57) ABSTRACT

According to a semiconductor device of the present invention, a layer of an electric insulator is provided on a semiconductor substrate. A connection pad having a part exposed to a layer surface is provided in the layer. A transistor structure opposed to the connection pad across the electric insulator is provided on the semiconductor substrate. The transistor structure comprises a polysilicon gate opposed to the connection pad across the insulator in the thickness direction of the layer, and a diffusion region provided outside of the respective opposed side edges of the polysilicon gate on a plane where the polysilicon gate is formed. As a result, according to the present invention, a power supply noise between I/O is absorbed and there is provided an excellent effect on an EMI and an EMS especially.

10 Claims, 6 Drawing Sheets

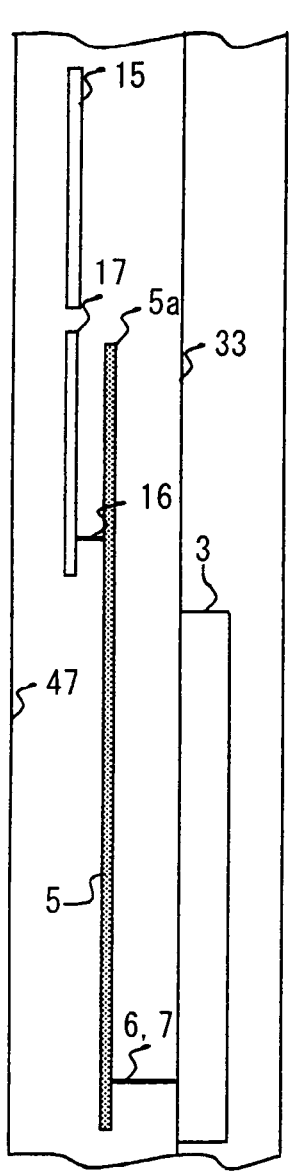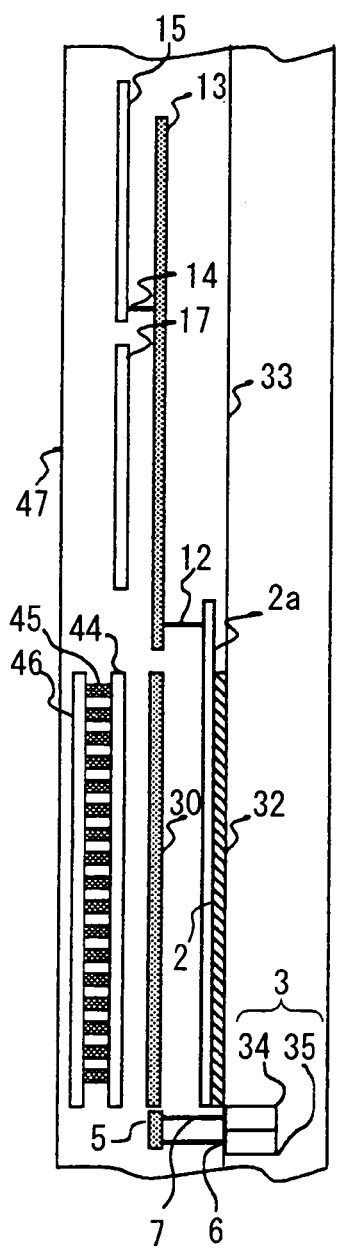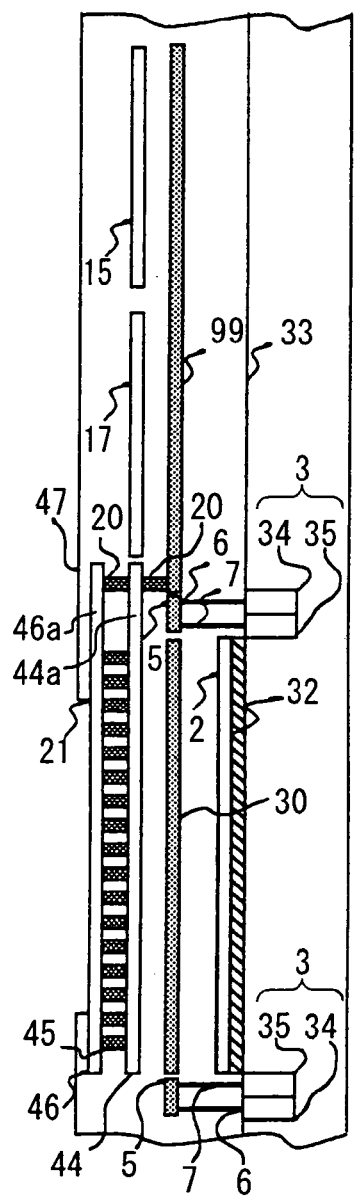

F I G. 6
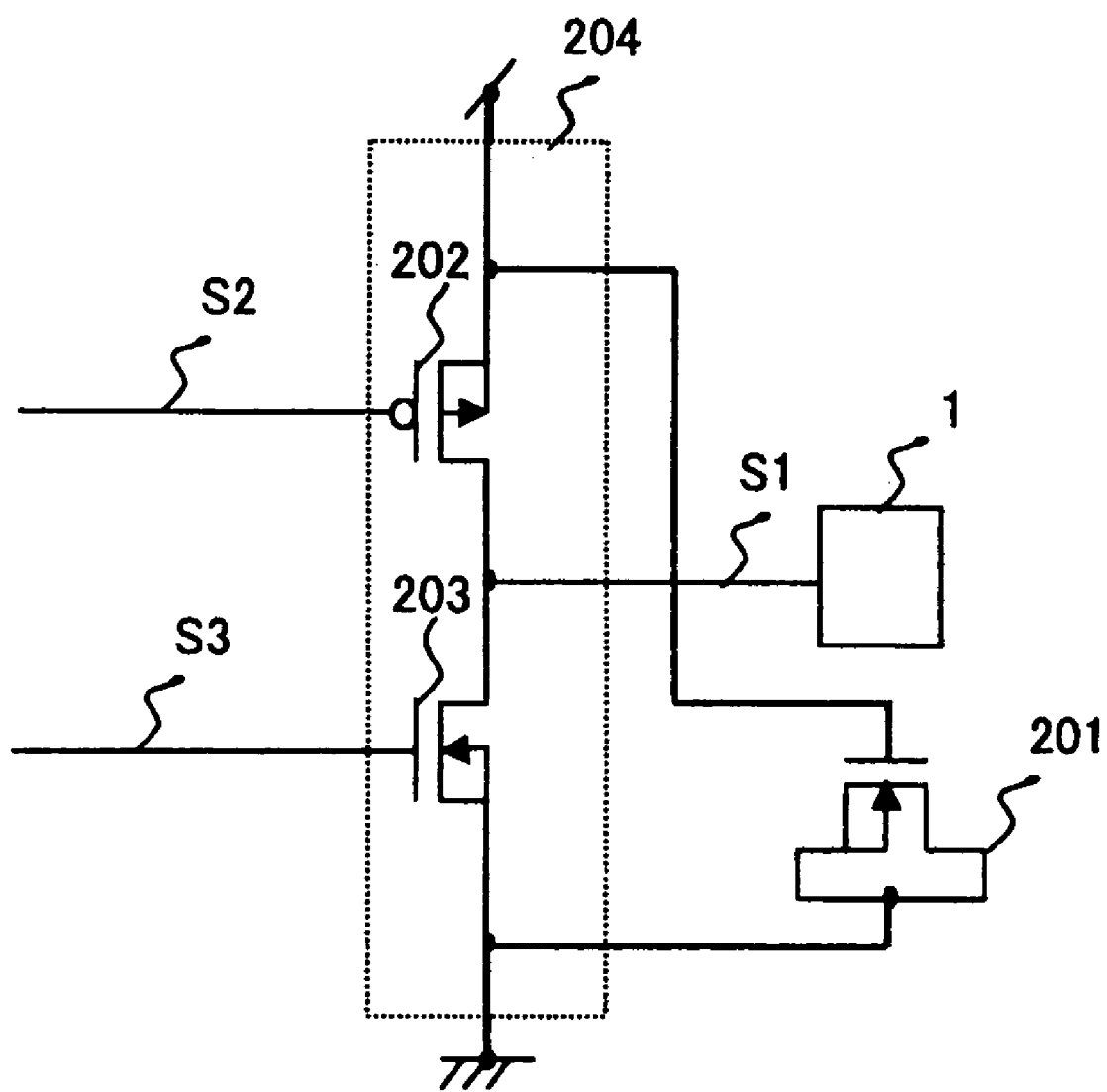

SEMICONDUCTOR DEVICE

FIELD OF THE INVENTION

The present invention relates a semiconductor device comprising capacitance between power supplies with a transistor in order to implement reinforcement of electromagnetic compatibility (referred to as EMC hereinafter) of a large-scale integration (referred to as an LSI hereinafter).

BACKGROUND OF THE INVENTION

Recently, an electric apparatus incorporating an LSI has been increasingly progressed in which functions are enhanced, higher speed is implemented and supply voltage is lowered. Accordingly, there is a strong demand for the LSI which is enhanced in function, high in speed and lowered in voltage. In order to answer the demand, an LSI structure and its manufacturing process are further miniaturized.

However, the miniaturized LSI is likely to cause a malfunction due to an intrusion noise. In addition, the high-speed LSI is likely to radiate noise outside of the LSI. The noise radiated from the LSI causes radio interference in other devices.

Measures to the EMC of the LSI are taken by changing a structure of a substrate and an electric device to which the LSI is mounted or adding a component to reduce the noise. However, such measures to the EMC causes manufacturing costs to be increased. Furthermore, measures taken by adding the component for the noise have reached a limit because of the miniaturization of the electric device itself. Thus, there is a strong demand for measures to the EMC in conjunction with provided high function and high speed in the LSI.

According to the LSI, the total amount of electric capacitance (referred to as total capacitance hereinafter) formed in the LSI is effective in the measures to the EMC. In addition, to insert a bypass capacitor between a power supply line of the LSI and the GND or between an emitter and the GND is effective in the EMC measures.

However, as the process becomes fine or a chip area is miniaturized, the total capacitance of the LSI is reduced. In addition, it is difficult to mount the bypass capacitor in the miniaturized LSI.

FIGS. 12 and 13 show an example of a layout configuration of the conventional semiconductor circuit. Referring to FIGS. 12 and 13, reference numeral 403 designates a P-type semiconductor substrate, reference numeral 405 designates an electric insulator layer formed on the P-type semiconductor substrate 403, reference numeral 400 designates a connection pad arranged parallel to the P-type semiconductor substrate 403 at a middle position of the electric insulator layer 405 in the thickness direction thereof, reference numeral 401 designates a wiring pattern connected to an end of the connection pad 400, and reference numeral 402 designates an opening of the electric insulator layer 405 provided at an upper portion of the connection pad 400. The connection pad 400 is exposed to the outside by the opening 402. Another circuit element is not disposed between the connection pad 400 and the semiconductor substrate 403. This is because a withstand voltage of a probe needle at the time of a probing test of an LSI wafer or a withstand voltage of wire bonding at the time of assembly are to be secured to increase the reliability.

According to the example of the layout configuration of such a semiconductor device, electrostatic discharge (ESD) coming from the LSI terminals becomes problematic. Conventionally, it is known that Unexamined Patent Publication No. 02-97053 discloses a configuration in which a withstand voltage of the ESD is raised. According to this configuration, a polysilicon layer is provided between the connection pad 400 and the semiconductor P-type substrate 403. The polysilicon layer and the connection pad 400 form parallel plane plates across the electric insulator layer (dielectric film) 405. The polysilicon layer is electrically connected to the power supply. Thus, a capacitor is formed between the connection pad 400 and the power supply. In this configuration, a withstand voltage of a surge can be raised without increasing the chip area due to the addition of the protection electronic components.

However, even in the semiconductor circuit in which the withstand voltage of the surge is raised, there is not provided a configuration which is effective to EMI (Electromagnetic Interference) which causes a malfunction of other devices due to an electromagnetic noise discharged toward the outside during the operation of the LSI, or EMS (Electromagnetic Susceptibility) which causes a malfunction of the LSI itself by an external noise generated during operations of the other devices.

SUMMARY OF THE INVENTION

It is a main object of the present invention to provide a semiconductor device in which a capacitor with large capacitance formed of a gate oxide thin film of a transistor is formed at a connection pad and which substantially contributes to enhancement of both EMI and EMS as a bypass capacitor without changing a layout area.

In order to attain the above object, the present invention provides a connection pad having a part exposed to a layer surface, in a layer of an electric insulator provided on a semiconductor substrate. In addition, the present invention provides a transistor structure opposed to the connection pad across the electric insulator, on the semiconductor substrate. Thus, according to the present invention, the power supply noise between the I/O can be absorbed and there is provided an outstanding effect especially for the EMI and EMS.

BRIEF DESCRIPTION OF THE DRAWINGS

Objects other than the above of the present invention become more apparent from the following description of the embodiments and clearly specified by the terms of the appended claims. Implementation of the present invention reminds those skilled in the art of many various effects which were not referred in this specification.

FIG. 3 is a sectional view taken along line b–b' in FIG. 1;

FIG. 4 is a sectional view taken along line c–c' in FIG. 1;

FIG. 5 is a sectional view taken along line d–d' in FIG. 1;

FIG. 6 is a block diagram showing an I/O circuit comprising a semiconductor device according the first embodiment;

DETAILED DESCRIPTION OF THE INVENTION

Figure 1:
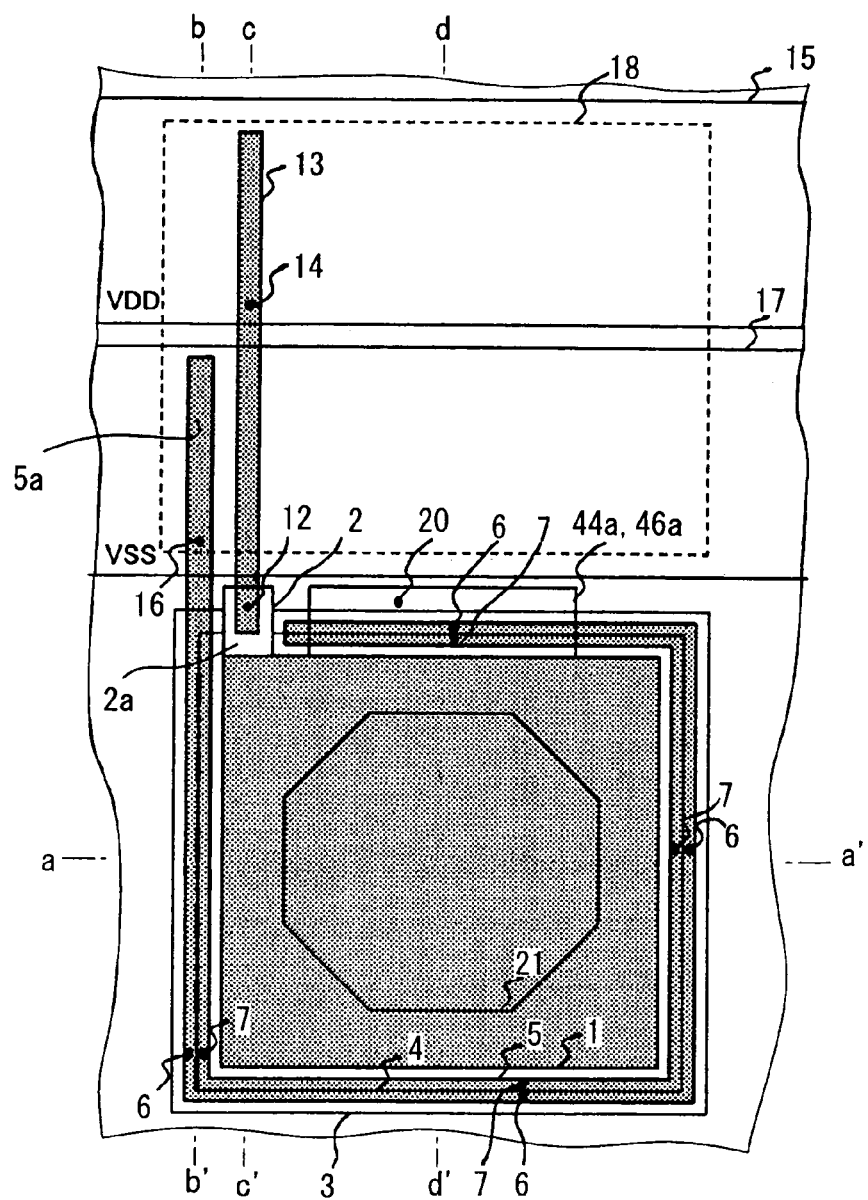
FIG. 1 is a layout diagram showing a semiconductor device according to a first preferred embodiment of the present invention.

Hereinafter, preferred embodiments of the present invention are described with reference to the drawings.

First Preferred Embodiment

FIGS. 1 to 5 show a configuration of a semiconductor device according to a first preferred embodiment of the present invention. This semiconductor device, for example, is incorporated in an LSI as its I/O circuit. Semiconductor circuits of this embodiment are provided in a P-type semiconductor substrate 33 and an insulator film 47 laminated and disposed on the P-type semiconductor substrate 33.

The semiconductor circuit comprises an N-type transistor structure consisting of a diffusion region 3 and a polysilicon gate 2, and a connection pad 1. The N-type transistor structure is opposed to the connection pad 1 across an electric insulator constituting an electric insulator film 47. The N-type transistor structure is opposed to the connection pad 1 in the thickness direction of the electric insulator film 47.

The polysilicon gate 2 is provided on a surface of the P-type semiconductor substrate 33. The polysilicon gate 2 is arranged so as to be opposed to the connection pad 1 in the thickness direction of the insulator film 47. The polysilicon gate 2 has the same plane configuration as that of the electrode pad 1. As an example of the plane configuration of the electrode pad 1 and the polysilicon gate 2, there are a circle, a polygon and the like. According to this embodiment, a rectangle configuration is employed. The whole of the polysilicon gate 2 is arranged so as to overlap the electrode pad 1 having the same configuration.

A gate oxide film 32 is provided between the polysilicon gate 2 and the P-type semiconductor substrate 33. When the P-type semiconductor substrate 33 is formed of a silicon substrate, the electric insulator constituting the electric insulator layer 47 is formed of a silicon oxide film or a silicon nitride film, for example. The polysilicon gate 2 has a portion 2a extending from the diffusion region 3 toward the outside over the substrate. The gate oxide film 32 is not provided under the portion 2a.

The diffusion region 3 is formed inside of the P-type semiconductor substrate 33. The diffusion region 3 is arranged so as to surround the whole periphery of the side edges of the polysilicon gate 2. Therefore, the diffusion region 3 is arranged outside of the respective opposite side edges of the polysilicon gate 2 on the plane where the polysilicon gate 2 is formed. The diffusion region 3 comprises a P-type diffusion region 34 and an N-type diffusion region 35. The diffusion region 3 is circularly arranged such that the N-type diffusion region 35 is formed inside and the P-type diffusion region 34 is formed outside.

The connection pad 1 is provided in the electric insulator layer 47. The connection pad 1 comprises a first electrode pad 30, a second electrode pad 44 and a third electrode pad 46. These electrode pads 30, 44 and 46 and the polysilicon gate 2 are arranged so as to be opposed parallel to each other. These electrode pads 30, 44 and 46 are arranged so as to be opposed in the thickness direction of the layer 47. The first electrode pad 30 is arranged closest to the polysilicon gate 2. The third electrode pad 46 is arranged farthest apart from the polysilicon gate 2. The second electrode pad 44 is arranged between the first and second electrode pads 30 and 46. The electric insulator constituting the electric insulator layer 47 intervenes between the first electrode pad 30 and the polysilicon gate 2 and both are electrically insulated by the electric insulator. The electric insulator constituting the electric insulator layer 47 intervenes between the first and second electrode pads 30 and 44, and both are electrically insulated by the electric insulator. Although the electric insulator layer 47 intervenes between the second and third electrode pads 44 and 46 so as to electrically insulate both, the second and third electrode pads 44 and 46 are electrically connected by an electric contact column group 45 provided in the electric insulator layer 47. According to this embodiment, the second and third electrode pads 44 and 46 constitute a pair of electrode pads and the first electrode pad 30 constitutes another electrode pad.

A first wiring 5 and a second wiring 13 are provided in the electric insulator layer 47. The first wiring 5 and the second wiring 13 are provided on the same plane as the first electrode pad 30. The first wiring 5 has a circular configuration and arranged outside of the first electrode pad 30 on the plane. The first wiring 5 has the same plane configuration as the diffusion region 3. The first wiring 5 is arranged so as to be opposed to the diffusion region 3 in the thickness direction of the layer 47. However, a portion of the first wiring 5 which is opposed to the portion 2a of the polysilicon gate 2 is notched. The first wiring layer 5 has a portion 5a extending from the body of the circular first wiring 5 toward the outside over the substrate. The portion 5a has a configuration linearly extending in the same direction as the portion 2a.

The second wiring 13 is provided in a region where the first wiring 5 is notched. The second wiring 13 has a configuration linearly extending along the same direction as the portion 2a of the polysilicon gate 2. One end of the second wiring 13 is arranged so as to be opposed to the portion 2a. The second wiring 13 is arranged parallel to the portion 5a.

A wiring 15 for VDD power supply and a wiring 17 for VSS power supply are provided in the electric insulator layer 47. The wiring 15 for VDD power supply and the wiring 17 for VSS power supply are arranged on the same plane as the second pad wiring layer 44. The wirings 15 and 17 are provided so as to be opposed to the ends of the second wiring 13 and the portion 5a, respectively in the thickness direction of the layer 47. The wirings 15 and 17 are arranged parallel to each other. The wirings 15 and 17 are arranged in a direction perpendicular to the second wiring 13 and the portion 5a.

Electric contact columns 6, 7, 12, 14, 16 and 20 for interlayer connecting are provided in the electric insulator layer 47. The first wiring 5 is electrically connected to the P-type diffusion region 34 by the electric contact column 6. The first wiring 5 is electrically connected to the N-type diffusion region 35 by the electric contact column 7. The first wiring 5 is electrically connected to the VSS power supply wiring 17 by the electric contact column 16. The second wiring 13 is electrically connected to the polysilicon gate 2 by the electric contact column 12. The second wiring 13 is electrically connected to the VDD power supply wiring 15 by the electric contact column 14.

Figure 2:
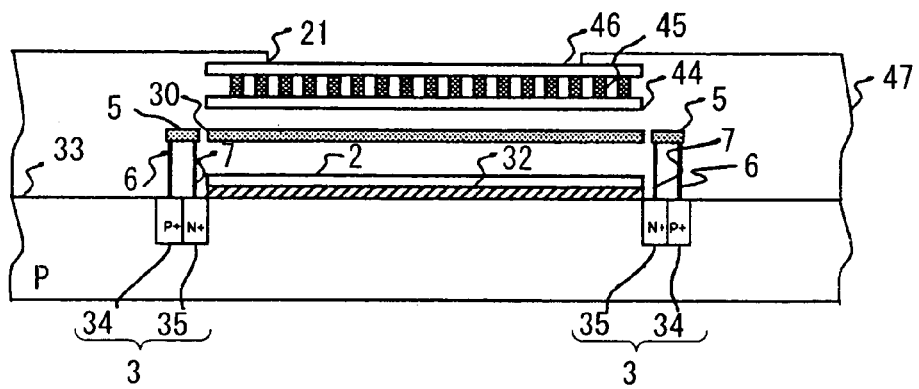
FIG. 2 is a sectional view taken along line a–a' in FIG. 1.

Referring to FIGS. 1 and 2, reference numeral 21 designates an opening provided at the surface of the electric insulator layer 47. The third electrode pad 46 is exposed to the outside of the electric insulator layer 47 by the opening 21. Wire bonding connection is implemented to the third electrode pad 46 exposed to the outside by the opening 21. Reference numeral 4 designates a boundary line between the P-type diffusion region 34 and the N-type diffusion region 35. Reference numeral 18 designates a region where the I/O circuit is formed on the P-type semiconductor substrate 33. Reference numeral 99 designates a third wiring provided in the region 18 for the I/O circuit. The third wiring 99 is arranged on the same plane as the first electrode pad 30 and the first wiring 5. The third wiring 99 is electrically connected to the second electrode pad 44 and the third electrode pad 46 by the electric contact column 20. The second electrode pad 44 and the third electrode pad 46 have the following configuration so as to be electrically connected to the third wiring 99. That is, the second electrode pad 44 and the third electrode pad 46 have portions 44a and 46a, respectively extending toward the third wiring 99. The third wiring 99 is electrically connected to the portions 44a and 46a through the electric contact column 20.

According to this embodiment, as shown in FIG. 2, the N-type transistor structure is formed such that diffusion regions 3 (each comprises the P-type diffusion region 34 and the N-type diffusion region 35) are arranged on both sides of the polysilicon gate 2 and the gate oxide film 32 so as to sandwich them in the sectional direction of a–a' in FIG. 1. Similarly, as shown in FIG. 5, the N-type transistor structure is formed such that the diffusion regions 3 (each comprises the P-type diffusion region 34 and the N-type diffusion region 35) are arranged on both sides of the polysilicon gate 2 and the gate oxide film 32 so as to sandwich them in the sectional direction of d–d' in FIG. 1. These N-type transistor structures are arranged under the connection pad 1.

According to this embodiment, since the diffusion region 3 is provided so as to surround the polysilicon gate 2, the N-type transistor structures are arranged in the respective plural directions (a–a' direction and d–d' direction in FIG. 1). These N-type transistor structures function as capacitance.

These N-type transistor structures have almost the same layout configuration as the connection pad 1. Therefore, according to this embodiment, the plural transistor structures coexist in a layout region without having an adverse effect on each other. Accordingly, in this embodiment, a large area of capacitance can be formed without increasing a layout size required for forming the capacitance.

According to this embodiment, as shown in FIG. 4 which is a sectional view taken along line c–c' in FIG. 1, the polysilicon gate 2 has the portion 2a extending from the connection pad 1 toward the outside in view of plane direction and this portion 2a is electrically connected to another wiring (the second wiring 13) through the electric contact column 12. Therefore, physical deformation generated in accordance with formation of the electric contact column is hard to be effected on the connection pad 1. Consequently, physical planarity and structural uniformity of the connection pad 1 can be secured.

The transistor could be destroyed in the manufacturing process depending on the planarity and the structural uniformity of the connection pad 1. The reason for that is as follows. A probing stress is generated in the connection pad 1 at the time of a probe test of LSI for the connection pad 1 through the opening 21. In addition, a wire bonding stress is generated in the connection pad 1 at the time of the LSI manufacturing process. When these stresses are inhomogeneously exerted on the gate oxide film 32, the gate oxide film 32 is destroyed. Meanwhile, according to this embodiment, since the physical planarity and the structural uniformity of the connection pad 1 is secured, the stresses are uniformly exerted on the gate oxide film 32 and it is prevented from being destroyed. Thus, according to this embodiment, destruction of the gate oxide film 32 due to the stresses generated in the manufacturing process is prevented and reliability of the transistor is improved.

Furthermore, since the second wiring 13 is disposed outside of the connection pad 1 on the plane of the second wiring 13 and the connection pad 1, even when the above stresses are exerted on the connection pad 1 during manufacturing, the second wiring 13 and the electric contact column 12 are not destroyed.

In addition, the second wiring 13 and the connection pad 1 are arranged in the electric insulator layer 47 without being overlapped with each other on the plane. Therefore, the connection pad 1 and the second wiring 13 can be patterned so as to coexist on the same wiring layout. Thus, the semiconductor layout of this embodiment can be designed and manufactured without increasing the number of the semiconductor processes.

According to this embodiment, the diffusion region 3 is arranged outside of the connection pad 1 so as to surround it on the plane where the connection pad 1 is formed. The P-type diffusion region 34 and the N-type diffusion region 35 of the diffusion region 3 are electrically connected to the first wiring 5 through the electric contact columns 6 and 7. Thus, according to this embodiment, the connection part of the diffusion region 3 and the first wiring 5 is disposed outside of the connection pad 1. As a result, the above connection part is not likely to have a physical effect on the connection pad 1. Thus, the physical planarity and the structural uniformity of the connection pad 1 are further improved and the destruction of the gate oxide film 32 due to the stresses exerted on the connection pad 1 at the time of manufacturing can be further prevented.

Still further, since the first wiring 5 is arranged outside of the connection pad 1 on the plane where the first wiring 5 and the connection pad 1 are formed, even when the stress generated in the process of the manufacturing is exerted on the connection pad 1, the first wiring 5 and the electric columns 6 and 7 are not destroyed.

In addition, the first wiring 5 and the connection pad 1 are not overlapped with each other on the plane and both are arranged in the electric insulator layer 47. Therefore, the connection pad 1 and the first wiring 5 can be patterned so as to coexist on the same wiring layout. Thus, the semiconductor layout of this embodiment can be designed and manufactured without increasing the number of the semiconductor processes.

Furthermore, in the transistor structure formed in the section of a–a' (a section of X direction, refer to FIG. 2) in the semiconductor layout shown in FIG. 1, the first electrode pad 30 having almost the same size of the polysilicon gate 2 is provided between the connection pad 1 and the polysilicon gate 2. Similarly, in the transistor structure formed in the section of d–d' (a section of Y direction, refer to FIG. 4) in the semiconductor layout shown in FIG. 1, the first electrode pad 30 having almost the same size of the polysilicon gate 2 is provided between the connection pad 1 and the polysilicon gate 2. Thus, this embodiment provides the following structural advantages.

Since the first electrode pad 30 is arranged between the second electrode pad 44 and the polysilicon gate 2, the electric insulator layer 47 intervening between the second electrode pad 44 and the polysilicon gate 2 is divided by the first electrode pad 30. Therefore, even when a crack is generated in the electric insulator (more specifically the electric insulator layer 47) intervening between the second electrode pad 44 and the first electrode pad 30 due to the stress applied to the connection pad 1 during the manufacturing process, a physical impact caused by the crack is absorbed by the first electrode pad 30. Therefore, the physical impact due to the crack is not exerted on the electric insulator positioned between the polysilicon gate 2 and the first electrode pad 30. Thus, the crack is not generated in the electric insulator between the first electrode pad 30 and the polysilicon gate 2. When a crack is generated in the electric insulator between the first electrode pad 30 and the polysilicon gate 2, the gate oxide film 32 is destroyed. According to this embodiment, since the crack of the electric insulator can be prevented, the reliability of the transistor structure is improved.

Each of the plural transistor structures provided in the respective directions comprises the second electrode pad 44 and the third electrode pad 46. These pads 44 and 46 are electrically connected by the electric contact column group 45 arranged at constant intervals between the pads 44 and 46.

Thus, each transistor structure has a connection structure in which the pads are electrically connected by the electric contact column group 45 uniformly disposed. Accordingly, a film thickness between the second electrode pad 44 and the third electrode pad 46 can be large. Therefore, the stress applied to the connection pad 1 during the manufacturing process can be substantially reduced before it reaches the gate oxide film 32. As a result, the reliability concerning the destruction of the gate oxide film 32 is further improved.

According to this embodiment, the second wiring 13 connected to the polysilicon gate 2 of the N-type transistor is connected to the wiring 15 for VDD power supply. The first wiring 5 for supplying a potential to the diffusion region 3 of the N-type transistor is connected to the wiring 17 for VSS power supply. Thus, a capacitor is formed between the power supplies, and the power supply on the LSI can be safely kept. More specifically, according to this embodiment, as shown in FIG. 4, the second wiring 13 is electrically connected to the wiring 15 for VDD power supply via the shortest distance through the electric contact column 14. Furthermore, as shown in FIG. 3, the first wiring 5 is electrically connected to the wiring 17 for VSS power supply via the shortest distance through the electric contact column 16. The effect provided when the shortest connection structure is implemented is described with reference to FIG. 6.

An I/O circuit 204 shown in FIG. 6 is a circuit formed in the region 18 in FIG. 1, where the I/O circuit is formed. The I/O circuit 204 comprises a P-type output buffer 202 and an N-type output buffer 203. A source of the P-type output buffer 202 is connected to the VDD power supply of the I/O circuit 204 and a gate thereof is connected to a signal line S2, and a drain thereof is connected to the connection pad 1 through the signal line S1. A source of the N-type output buffer 203 is connected to the VSS power supply of the I/O circuit 204, a gate thereof is connected to a gate signal line S3 and a drain thereof is connected to the pad 1 through the signal line S1.

Referring to FIG. 6, the N-type transistor 201 constitutes the N-type transistor provided under the connection pad in FIGS. 1 to 5. In this configuration, it is assumed that the gate of the N-type transistor 201 is directly connected to the VDD power source of the I/O circuit 204 via the shortest distance. In addition, it is assumed that the drain and source of the N-type transistor 201 are directly connected to the VSS power source of the I/O circuit 204 via the shortest distance. Then, it is expected that an optimal bypass capacitor 201 is provided between the VDD power supply and the VSS power supply.

An operation of the I/O circuit 204 comprising the above configuration is described hereinafter. When the P-type output buffer 202 and the N-type output buffer 203 are repetitively turned on and off by receiving the gate input signals on the gate signal lines S2 and S3, a through current is generated between the output buffers every repeated operation. This through current is superimposed as a noise between the I/O power supplies and irradiated outside of the LSI as an EMI. In addition, since the one-through current is superimposed on the power supply between the I/O as a switching noise, a malfunction of the LSI is likely to be generated and an EMS withstand voltage deteriorates.

Meanwhile, in the I/O circuit 204, the N-type transistor 201 connected with low impedance via the shortest connection distance is electrically connected to the I/O power supply. Thus, the N-type transistor 201 operates as a bypass transistor and effectively absorbs the noise between the I/O power supplies. Consequently, the I/O circuit 204 incorporating the configuration of the present invention provides an excellent effect especially for the EMI and the EMS.

Second Preferred Embodiment

FIGS. 7 to 11 show a configuration of an I/O circuit of a semiconductor device according to a second preferred embodiment of the present invention. A semiconductor circuit of this embodiment has the same configuration as that of the first preferred embodiment basically. Therefore, in FIGS. 7 to 11, the same reference numerals are allotted to the same or similar parts as in FIGS. 1 to 5 and their description is omitted.

According to the first preferred embodiment, the N-type transistor structures are formed on the P-type semiconductor substrate 33. Meanwhile, according to this second preferred embodiment, P-type transistor structures are formed on the P-type semiconductor substrate 33. In this respect, the second preferred embodiment is different from the first preferred embodiment.

According to this embodiment, an n-well region 349 is formed in the P-type semiconductor substrate 33. The n-well region 349 is disposed under a polysilicon gate 2 and a gate oxide film 32. A diffusion region 3 circularly arranged along peripheries of the polysilicon gate 2 and the gate oxide film 32 outside thereof is constituted as follows. That is, the diffusion region 3 comprises a P-type diffusion region 334 arranged inside of the circular configuration, and an N-type diffusion region 335 arranged outside thereof. According to this embodiment, positions of the N-type diffusion region 335 and the P-type diffusion region 334 is opposite to that of the first embodiment. The polysilicon gate 2 is electrically connected to a wiring 315 for VSS power supply through a second wiring 13 and electric contact columns 12 and 14. The diffusion region 3 is electrically connected to a wiring 317 for VDD power supply through a first wiring 5 and electric contact columns 6, 7 and 16. In addition, positions of the VDD power supply wiring 317 and the VSS power supply wiring 315 is opposite to that of the first embodiment.

Such change in configuration of the diffusion region 3 is implemented by making the transistor structure P-type.

Figure 7:
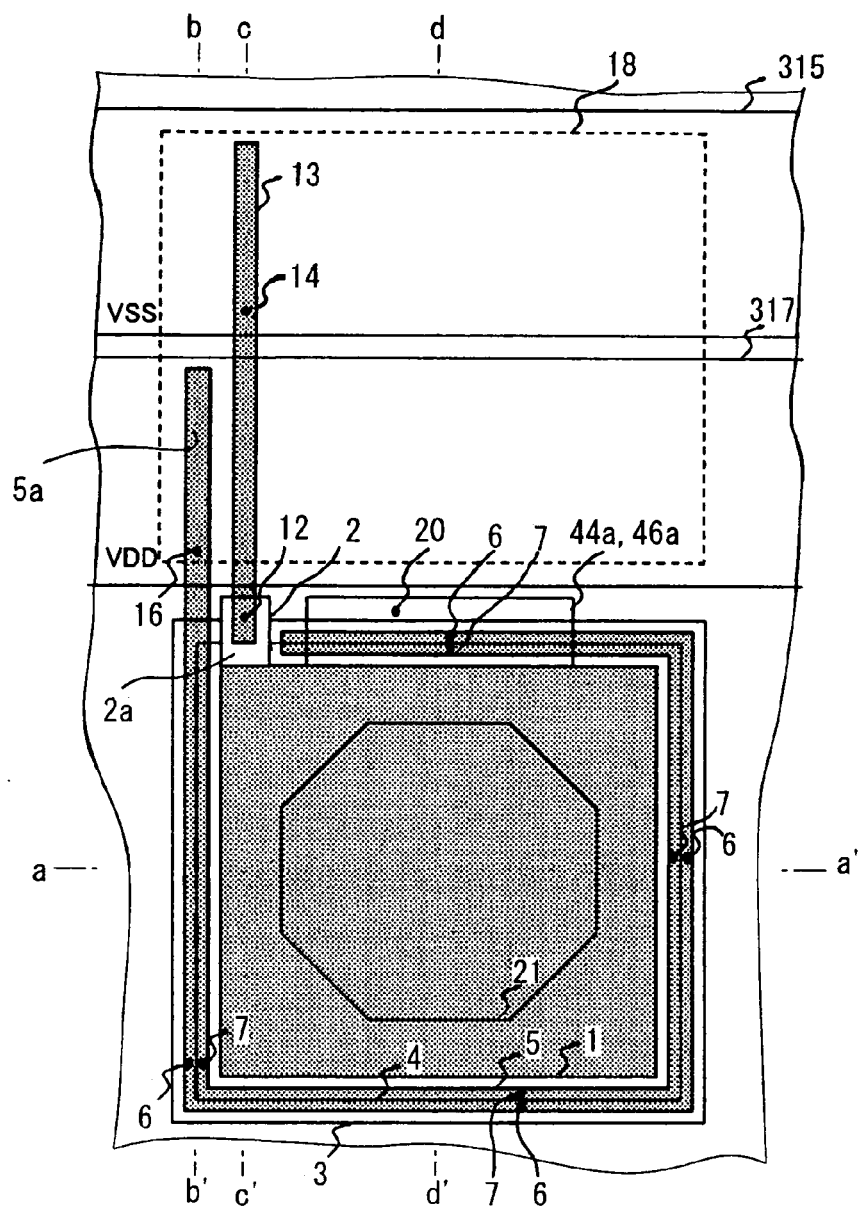
FIG. 7 is a layout diagram showing a semiconductor device according to a second preferred embodiment of the present invention.
Figure 8:
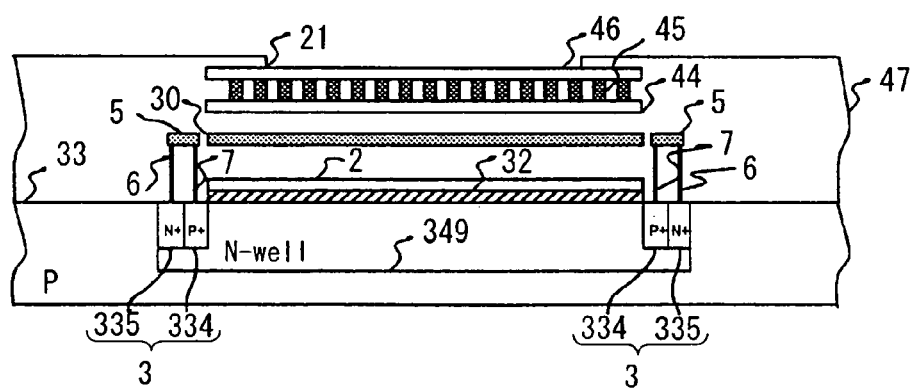
FIG. 8 is a sectional view taken along line a–a' in FIG. 1.
Figure 9:
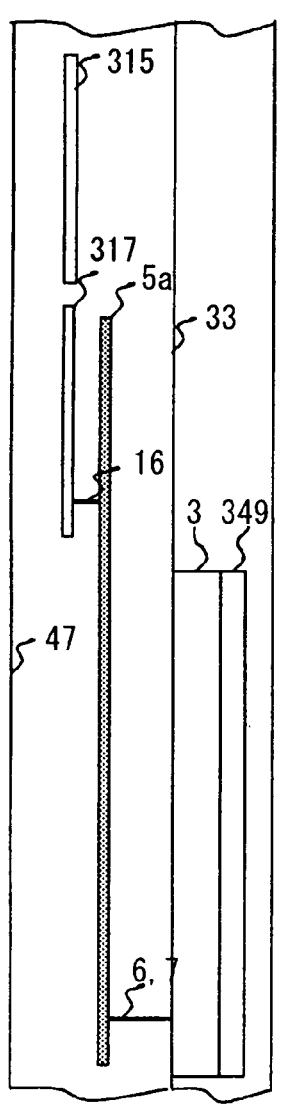
FIG. 9 is a sectional view taken along line b–b' in FIG. 1.
Figure 10:
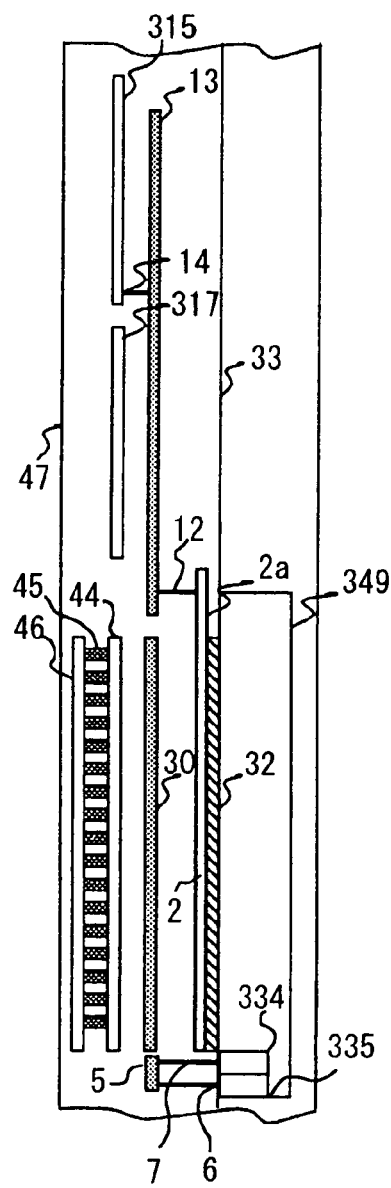
FIG. 10 is a sectional view taken along line c–c' in FIG. 1.
Figure 11:
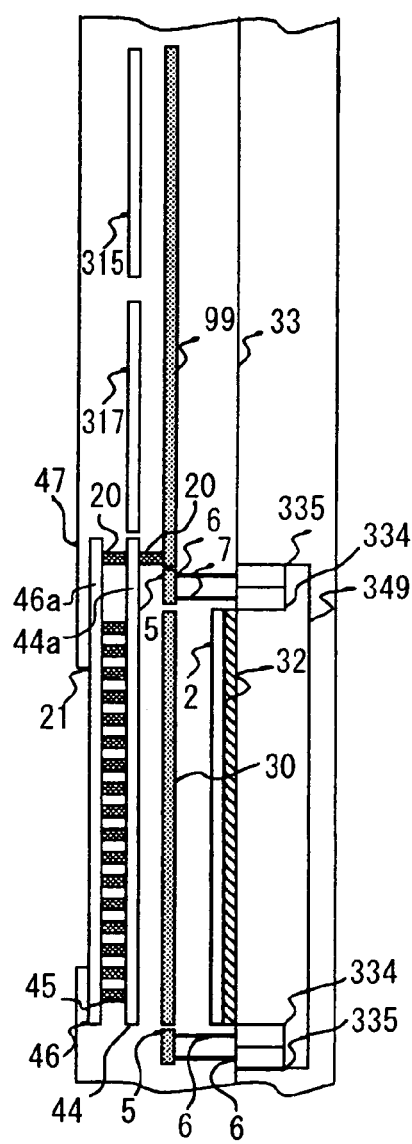
FIG. 11 is a sectional view taken along line d–d' in FIG. 1.
Figure 12:
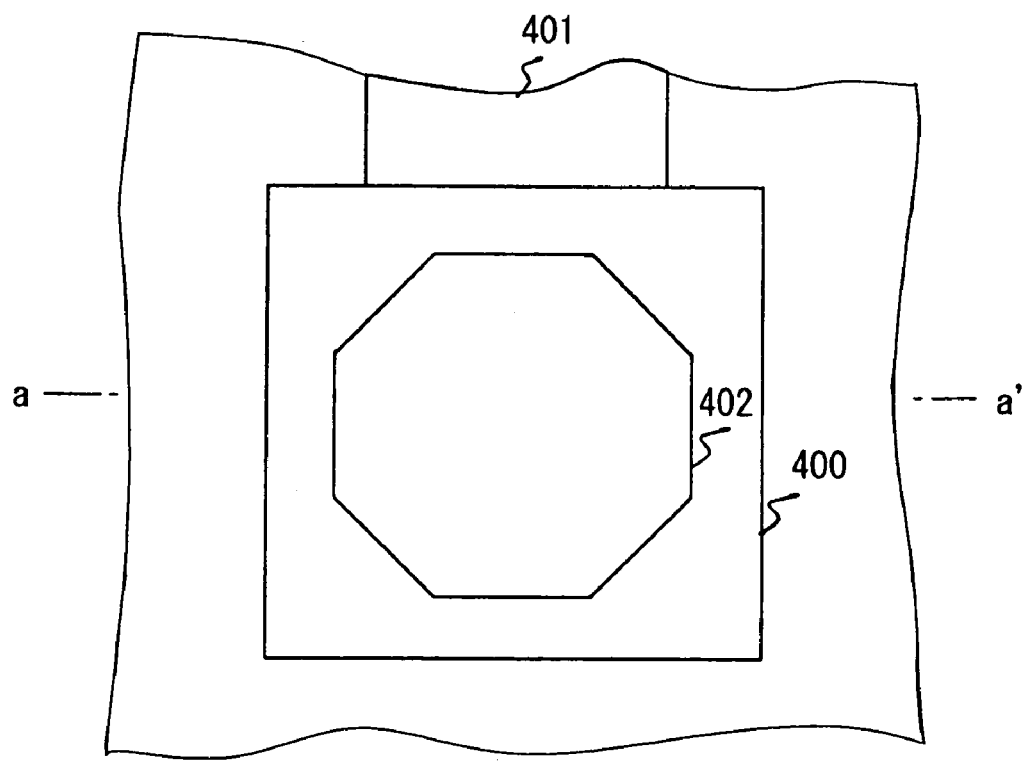
FIG. 12 is a layout diagram showing a conventional I/O circuit.
Figure 13:
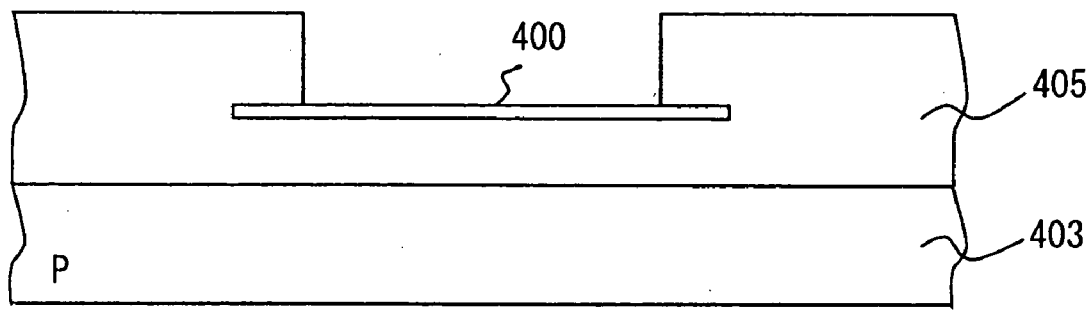
FIG. 13 is a sectional view taken along line a–a' in FIG. 12.

According to this embodiment, as shown in FIG. 8, the P-type transistor structure is formed such that diffusion regions 3 (each comprises the P-type diffusion region 334 and the N-type diffusion region 335) are arranged on both sides of the polysilicon gate 2 and the gate oxide film 32 so as to sandwich them in a sectional direction of a–a' in FIG. 7. Similarly, as shown in FIG. 11, the P-type transistor structure is formed such that the diffusion regions 3 (each comprises the P-type diffusion region 334 and the N-type diffusion region 335) are arranged on both sides of the polysilicon gate 2 and the gate oxide film 32 so as to sandwich them in a sectional direction of d–d' in FIG. 7. These P-type transistor structures are arranged under a connection pad 1.

According to this embodiment, the P-type transistor structures are arranged in the plural directions (a–a' direction and d–d' direction). These P-type transistor structures have almost the same layout configuration as the connection pad 1. Therefore, according to this embodiment, the plural transistor structures coexist in a layout region without having an adverse effect on each other. Accordingly, in this embodiment, a large area of capacitance can be formed without increasing the layout size required for forming the capacitance. Since other effects provided in this embodiment are the same as in the first embodiment, the description thereof is omitted here.

Thus, as is clear from the above two embodiments, the semiconductor device according to the present invention has a configuration which acts as the bypass capacitor between power supplies. Therefore, it absorbs a power supply noise between the I/O and provides an excellent effect especially on the EMI and the EMS. Furthermore, since the structure operating as the bypass capacitor in the present invention is a transistor structure which can be easily arranged in accordance with the arrangement of the VDD line and the VSS line between the I/O power supplies in the semiconductor layout, the bypass capacitor can be optionally configured according to the present invention.

Furthermore, according to the present invention, the bypass capacitor between the power supplies can be formed between the I/O power supplies without varying the layout area. In addition, according to the present invention, there can be implemented a low-impedance connection configuration which is electrically connected in a configuration with a power supply wiring distance minimized. Consequently, the present invention provides an effect especially on lowering of the EMI and enhancing the EMS. Furthermore, the I/O circuit can be incorporated in all terminals of a one-chip LSI, thereby to largely contribute to enhancement in quality of the LSI.

Although the present invention was described with reference to the most preferred embodiments in detail, the combination and arrangement of the components in the preferred embodiments can be variously changed within the spirit and scope of the present invention claimed hereinafter.

What is claimed is:

1. A semiconductor device comprising:
   a semiconductor substrate;
   a layer of an electric insulator provided on the semiconductor substrate;
   a connection pad provided in the layer and having a part exposed to a layer surface; and
   a transistor structure provided on the semiconductor substrate and opposed to the connection pad across the electric insulator,
   wherein the transistor structure comprises:
   a polysilicon gate opposed to the connection pad across the insulator in the thickness direction of the layer; and
   the polysilicon gate has the same plane configuration as that of the connection pad, and
   a diffusion region provided outside of respective opposite side edges of the polysilicon gate on a plane where the polysilicon gate is formed.

2. A semiconductor device according to claim 1, wherein the diffusion region is arranged outside of the polysilicon gate so as to surround the side edges thereof on the plane where the polysilicon gate is formed.

3. A semiconductor device according to claim 1, comprising a wiring provided in the layer and connected to the diffusion region,
   wherein the diffusion region has a part positioned outside of a portion opposed to the connection pad on the plane thereof and electrically connected to the wiring at this part.

4. A semiconductor device according to claim 1, comprising a wiring provided in the layer and connected to the polysilicon gate,
   wherein the polysilicon gate has a part positioned outside of a portion opposed to the connection pad on the plane thereof and electrically connected to the wiring at this part.

5. A semiconductor device according to claim 1,
   wherein the connection pad comprises a pair of electrode pads opposed across the electric insulator in the thickness direction of the layer; and
   an electric contact column group provided between the electrode pads to electrically connect both of the electrode pads.

6. A semiconductor device according to claim 5, wherein another electrode pad is provided between the pair of electrode pads and the polysilicon gate, and this another electrode pad is opposed to the pair of electrode pads and the polysilicon gate, respectively across the electric insulator.

7. A semiconductor device according to claim 1, wherein the transistor structure is an N-type transistor structure,
   the electric insulator layer comprises a wiring for VDD power supply and a wiring for VSS power supply; and
   the polysilicon gate is electrically connected to the wiring for VDD power supply and the diffusion region is electrically connected to the wiring for VSS power supply.

8. A semiconductor device according to claim 7, wherein the polysilicon gate is electrically connected to the wiring for VDD power supply via the shortest distance and the diffusion region is electrically connected to the wiring for VSS power supply via the shortest distance.

9. A semiconductor device according to claim 1, wherein the transistor structure is a P-type transistor structure,
   the electric insulator layer comprises a wiring for VDD power supply and a wiring for VSS power supply, and
   the polysilicon gate is electrically connected to the wiring for VSS power supply and the diffusion region is electrically connected to the wiring for VDD power supply.

10. A semiconductor device according to claim 9, wherein the polysilicon gate is electrically connected to the wiring for VSS power supply via the shortest distance and the diffusion region is electrically connected to the wiring for VDD power supply via the shortest distance.

* * * * *